United States Patent
Fukuda et al.

(10) Patent No.: US 12,152,949 B2
(45) Date of Patent: Nov. 26, 2024

(54) METHOD OF MANUFACTURING MAGNETOSTRICTIVE TORQUE SENSOR SHAFT

(71) Applicant: NSK LTD., Tokyo (JP)

(72) Inventors: Kota Fukuda, Kanagawa (JP); Junji Ono, Kanagawa (JP); Teruyuki Nakamura, Tokyo (JP); Yuta Sugiyama, Tokyo (JP)

(73) Assignee: NSK LTD., Tokyo (JP)

( * ) Notice: Subject to any disclaimer, the term of this patent is extended or adjusted under 35 U.S.C. 154(b) by 0 days.

(21) Appl. No.: 17/416,850

(22) PCT Filed: Dec. 11, 2019

(86) PCT No.: PCT/JP2019/048462
§ 371 (c)(1),
(2) Date: Jun. 21, 2021

(87) PCT Pub. No.: WO2020/129770
PCT Pub. Date: Jun. 25, 2020

(65) Prior Publication Data
US 2022/0026294 A1 Jan. 27, 2022

(30) Foreign Application Priority Data

Dec. 20, 2018 (JP) ................. 2018-238574

(51) Int. Cl.
*G01L 3/10* (2006.01)
*B24C 1/10* (2006.01)
(Continued)

(52) U.S. Cl.
CPC ............ *G01L 3/102* (2013.01); *B24C 1/10* (2013.01); *C21D 8/065* (2013.01); *C21D 9/0075* (2013.01); *Y10T 29/479* (2015.01)

(58) Field of Classification Search
CPC .................................. Y10T 29/479
See application file for complete search history.

(56) References Cited

U.S. PATENT DOCUMENTS 1,840,237 A * 1/1932 Leighton ............ B23Q 3/00
72/389.1
4,964,308 A * 10/1990 Edo .................. G01L 3/102
73/862.333
(Continued)

FOREIGN PATENT DOCUMENTS

CN  108303203 A   7/2018
EP      687739 A1 * 12/1995 ............ B22F 1/0085
(Continued)

OTHER PUBLICATIONS

March Li, Carburizing, Among heat treatment techniques, carburizing is one of the most widely used for case hardening, Thermal Processing Magazine, Apr. 20, 2016, pp. 1-5 (Year: 2016).*

(Continued)

*Primary Examiner* — Sarang Afzali
(74) *Attorney, Agent, or Firm* — Sughrue Mion, PLLC

(57) ABSTRACT

A method of manufacturing a magnetostrictive torque sensor shaft (100) to which a sensor portion (2) of a magnetostrictive torque sensor (1) is mounted. The method includes heat treatment step of subjecting an iron-based shaft member to a carburizing, quenching, and tempering process, and a shot peening step of performing shot peening using a boron-free zirconia shot media having a Vickers hardness at least equal to 1100 and at most equal to 1300, at least in a position on the shaft member, after the heat treatment step, to which the sensor portion is to be attached. The surface of the shaft member, after shot peening, has a total error, including hysteresis error and angle error, of not more than 3%.

8 Claims, 6 Drawing Sheets

(51) Int. Cl.
  *C21D 8/06* (2006.01)
  *C21D 9/00* (2006.01)

(56) References Cited

U.S. PATENT DOCUMENTS

| | | | | |
|---|---|---|---|---|
| 5,205,145 | A * | 4/1993 | Ishino | G01L 3/103 |
| | | | | 29/90.7 |
| 5,280,729 | A * | 1/1994 | Aoki | G01L 3/105 |
| | | | | 73/862.333 |
| 5,409,415 | A * | 4/1995 | Kawanami | B24C 11/00 |
| | | | | 451/39 |
| 5,491,369 | A * | 2/1996 | Ishino | G01L 3/102 |
| | | | | 310/26 |
| 5,526,664 | A * | 6/1996 | Vetter | B24C 11/00 |
| | | | | 72/53 |
| 6,153,023 | A * | 11/2000 | Rokutanda | B24C 11/00 |
| | | | | 148/318 |
| 7,534,534 | B2 * | 5/2009 | Nakata | G03G 5/0618 |
| | | | | 430/127 |
| 8,332,998 | B2 * | 12/2012 | Kobayashi | B24C 1/10 |
| | | | | 29/90.7 |
| 10,279,675 | B2 * | 5/2019 | Kuroda | H02K 15/14 |
| 10,551,256 | B2 * | 2/2020 | Arimura | C25D 5/36 |
| 2005/0204830 | A1 * | 9/2005 | Kuroda | G01L 3/102 |
| | | | | 73/862.331 |
| 2010/0300168 | A1 * | 12/2010 | Ishikura | C21D 7/06 |
| | | | | 72/53 |
| 2018/0195142 | A1 | 7/2018 | Nakamura | |

FOREIGN PATENT DOCUMENTS

| | | | | |
|---|---|---|---|---|
| EP | 1178123 A1 * | 2/2002 | | C21D 7/02 |
| JP | 2002340701 A * | 11/2002 | | |
| JP | 2018-112451 A | 7/2018 | | |
| WO | WO-2015133277 A1 * | 9/2015 | | B60K 17/046 |

OTHER PUBLICATIONS

Cammett, Understanding the Peening Time Paradox, 2014. The Shot Peener, Spring 2014, pp. 10-14 (Year: 2014).*
International Preliminary Report on Patentability with the translation of Written opinion dated Jul. 1, 2021 from the International Bureau in International Application No. PCT/JP2019/048462.
International Search Report for PCT/JP2019/048462 dated, Mar. 10, 2020 (PCT/ISA/210).
Extended European Search Report dated Aug. 17, 2022 in Application No. 19900001.9.
Office Action issued Feb. 7, 2023 in Chinese Application No. 201980084090.8.
Mao Zhikang, "Machining Technology", Aviation Industry Press, May 1999, pp. 169-171 (7 pages total).
Office Action issued Jul. 8, 2023 in Chinese Application No. 201980084090.8.

* cited by examiner

METHOD OF MANUFACTURING MAGNETOSTRICTIVE TORQUE SENSOR SHAFT

CROSS REFERENCE TO RELATED APPLICATIONS

This application is a National Stage of International Application No. PCT/JP2019/048462 filed Dec. 11, 2019, claiming priority based on Japanese Patent Application No. 2018-238574 filed Dec. 20, 2018.

TECHNICAL FIELD

The present invention relates to a method for manufacturing a magnetostrictive torque sensor shaft.

BACKGROUND ART

Conventionally, a magnetostrictive torque sensor has been known. The magnetostrictive torque sensor uses a shaft having magnetostrictive characteristic whose magnetic permeability changes when stress is applied, and detects a torque applied to the shaft by detecting a change in magnetic permeability of the shaft when the torque is applied and the shaft is twisted as a change in inductance of a detecting coil.

The citation list information relating to the invention according to the present application includes Patent Document 1.

CITATION LIST

Patent Literature

Patent Document 1: JP2018-112451A

SUMMARY OF INVENTION

Technical Problem

It has been known that a steel material used for the shaft comprises a non-magnetic structure called retained austenite. The retained austenite is gamma-iron (γ-Fe) with face-centered cubic lattice structure in which the other elements are dissolved.

When the shaft includes a large amount of the non-magnetic retained austenite, the change in magnetic permeability when the torque is applied reduces, and thus it leads to decrease in sensitivity of the magnetostrictive torque sensor.

However, if the amount of the retained austenite in the entire shaft reduces by adjusting the conditions of heat treatment or the like, the toughness of the shaft may decrease, so that the shaft may be cracked.

In addition, the magnetostrictive torque sensor is used for, e.g., a transmission stroke control or an engine output control. Therefore, it is desirable to have a small error as much as possible to perform a reliable shift transmission.

Therefore, it is an object of the present invention to provide a method for manufacturing a magnetostrictive torque sensor shaft capable of improving sensor sensitivity and reducing an error while securing toughness.

Solution to Problem

For solving the above-mentioned problems, the object of the present invention is to provide a method for manufacturing a magnetostrictive torque sensor shaft to which a sensor portion of the magnetostrictive torque sensor is to be attached, the method comprising heat treatment step of subjecting an iron-based shaft member to a carburizing, quenching, and tempering process, and a shot peening step of performing shot peening using a steel shot media having a Vickers hardness at least equal to 1100 and at most equal to 1300 and being free of boron, at least in a position on the shaft member, after the heat treatment step, to which the sensor portion is to be attached.

Advantageous Effects of Invention

According to the present invention, it is possible to provide a method for manufacturing a magnetostrictive torque sensor shaft capable of improving sensor sensitivity and reducing errors while securing toughness.

DESCRIPTION OF EMBODIMENTS

Embodiments

Embodiments of the present invention will be explained in conjunction with appended drawings.

Explanation of a Magnetostrictive Torque Sensor

Figure 1A:
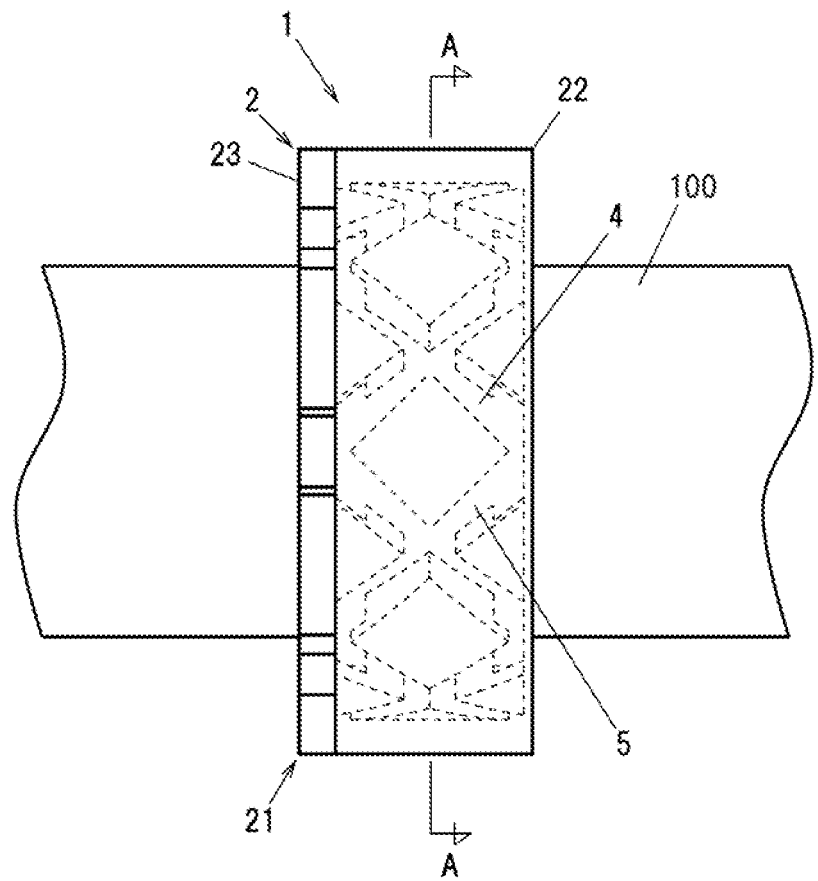
FIG. 1A is a side view showing an example of a sensor portion of a magnetostrictive torque sensor that is attached to a shaft.
Figure 1B:
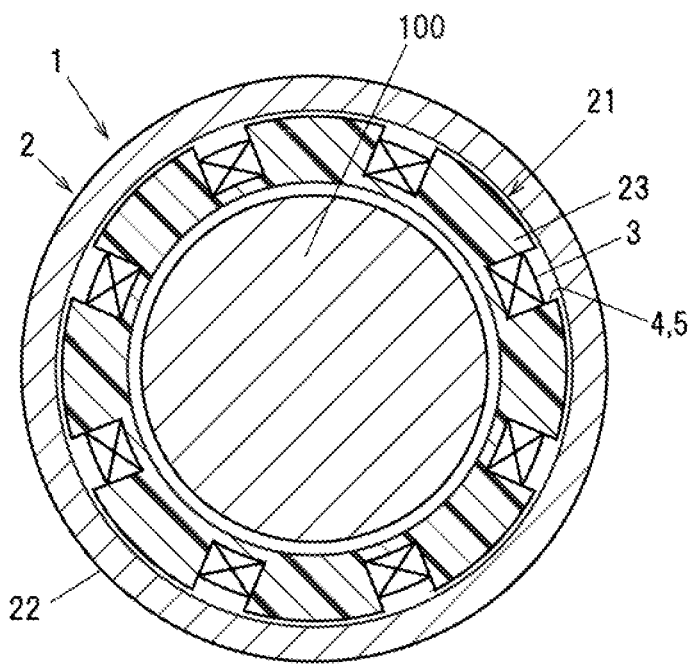
FIG. 1B is a cross-sectional view taken along line A-A in FIG. 1A.
Figure 2A:
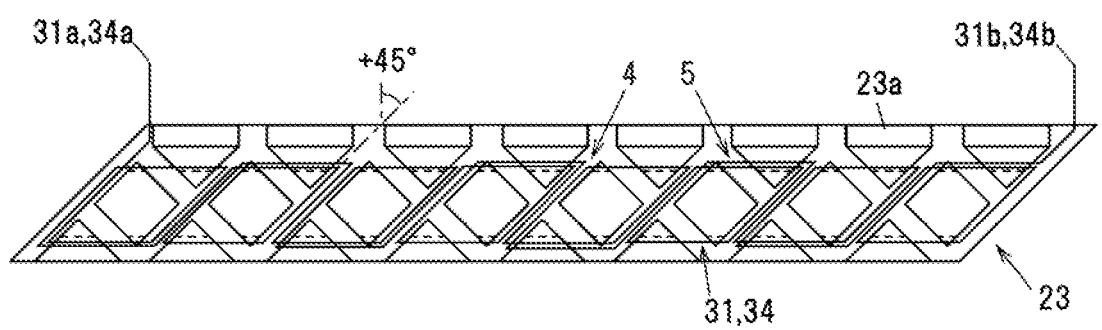
FIG. 2A is a plan view schematically showing a state in which a bobbin is deployed, which illustrates a first detecting coil and a fourth detecting coil.
Figure 2B:
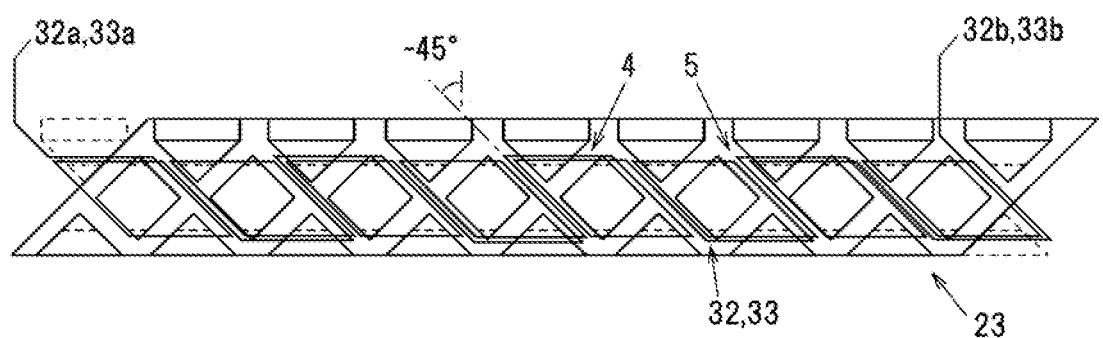
FIG. 2B is a plan view schematically showing a state in which the bobbin is deployed, which illustrates a second detecting coil and a third detecting coil.
Figure 3:
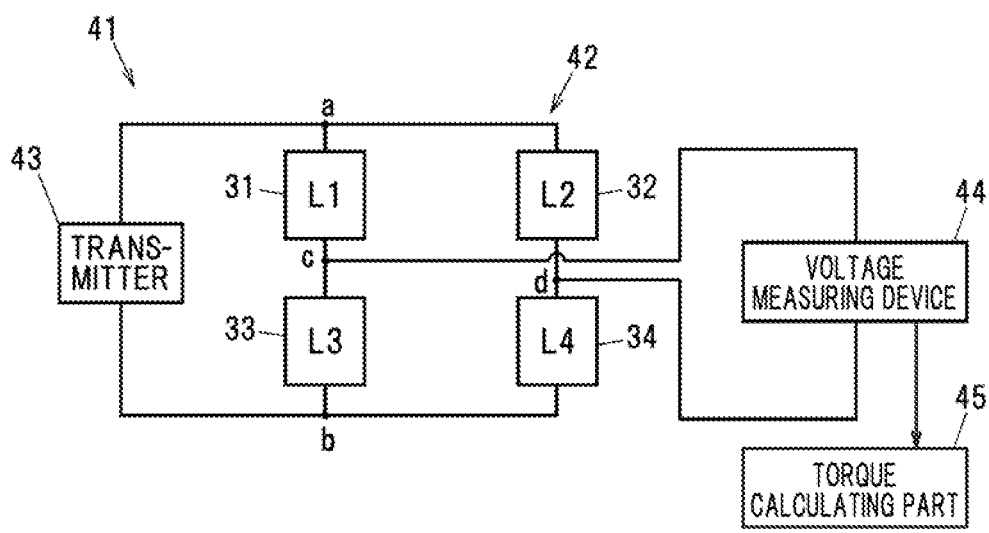
FIG. 3 is a circuit diagram showing an example of a measuring part for measuring torque applied to the shaft by detection signal of the torque sensor.

Firstly, a magnetostrictive torque sensor (hereinafter simply referred to as a torque sensor will be explained. FIG. 1A is a side view showing an example of a sensor portion of the torque sensor that is attached to a shaft. FIG. 1B is a cross-sectional view taken along line A-A in FIG. 1A. FIG. 2A is a plan view schematically showing a state in which a bobbin is deployed, which illustrates a first detecting coil and a fourth detecting coil. FIG. 2B is a plan view schematically showing a state in which the bobbin is deployed, which illustrates a second detecting coil and a third detecting coil. FIG. 3 is a circuit diagram showing an example of a measuring part to measure torque applied to the shaft by a detection signal of the torque sensor.

As shown in FIGS. 1A and 1B, the sensor portion 2 of the torque sensor 1 is attached around a magnetostrictive torque sensor shaft (hereinafter, simply referred to as a shaft) 100 having magnetostrictive characteristics. The torque sensor 1 measures torque (rotational torque) applied to the shaft 100.

The shaft 100 comprises a material having magnetostrictive characteristics (such as SCr420, SCM420, SNCM616, SUS440C, and SUS630), and is formed in a cylindrical shape (rod shape). For example, the shaft 100 is used for torque transmission in a powertrain system of a vehicle or a torque transmission in an engine of a vehicle.

The sensor portion 2 comprises a coil 21 and a magnetic ring 22. The magnetic ring 22 comprises a magnetic material (a ferromagnetic material) and is formed in a hollow cylindrical shape. The coil 21 is inserted into a hollow portion of the magnetic ring 22. The magnetic ring 22 serves to suppress leakage of a magnetic flux generated by the detecting coil 3 of the coil 21 to the outside, thereby decreasing the sensitivity.

The coil 21 comprises a bobbin 23 comprising a non-magnetic resin, and a plurality of detecting coils 3 formed by winding insulated wires around an outer periphery of the bobbin 23. The bobbin 23 is provided coaxially with the shaft 100 in such a manner as to be separated from the shaft 100, and is formed in a hollow cylindrical shape. A plurality of first inclined grooves 4 inclined at a predetermined angle (herein +45°) with respect to an axial direction of the shaft 100 and a plurality of second inclined grooves 5 inclined at a predetermined angle (herein −45°) with respect to a direction opposite to the first inclined grooves 4 along the axial direction are formed on an outer peripheral surface of the bobbin 23. The first inclined grooves 4 and the second inclined grooves 5 are formed of grooves concaved in a radial direction of the bobbin 23.

As shown in FIGS. 2A and 2B, the coil 21 comprises first to fourth detecting coils 31 to 34 as the detecting coils 3. The first detecting coil 31 and the fourth detecting coil 34 are formed by winding insulated wires around the bobbin 23 along the first inclined grooves 4. The second detecting coil 32 and the third detecting coil 33 are formed by winding insulated wires around the bobbin 23 along the second inclined grooves 5.

In FIG. 2A, reference signs 31a and Mb respectively indicate input and output ends of one layer of the first detecting coil 31, and reference signs 34a and 34b respectively indicate input and output ends of one layer of the fourth detecting coil 34. In FIG. 2B, reference signs 32a and 32h respectively indicate input and output ends of one layer of the second detecting coil 32, and reference signs 33a and 33b respectively indicate input and output ends of one layer of the third detecting coil 33. In addition, FIGS. 2A and 28 shows winding of the insulated wires for one turn. Each of the detecting coils 31 to 34 is formed by repeatedly winding the insulated wires to a target number of turns. In addition, the method for winding the insulated wires shown in FIGS. 2A and 2B is merely an example. The detecting coils 31 to 34 may be formed by using the other methods of winding.

The first detecting coil 31 and the fourth detecting coil 34 are provided for detecting a change in magnetic permeability of the shaft 100 in a first direction inclined at a predetermined angle (herein +45°) with respect to the axial direction of the shaft 100. The second detecting coil 32 and the third detecting coil 33 are provided for detecting a change in magnetic permeability of the shaft 100 in a second direction inclined at the predetermined angle (herein −45°) opposite to the first direction along the axial direction of the shaft 100.

As shown in FIG. 3, a measuring part 41 measures the torque applied to the shaft 100 by detecting changes in inductance of the first to fourth detecting coils 31 to 34.

The measuring part 41 comprises a bridge circuit 42 configured by annularly arranging the first detecting coil 31, the second detecting coil 32, the fourth detecting coil 34, and the third detecting coil 33 in this order, a transmitter 43 for applying alternating current (AC) voltage between a contact point a arranged between the first detecting coil 31 and the second detecting coil 32 and a contact point b arranged between the third detecting coil 33 and the fourth detecting coil 34, a voltage measuring circuit 44 for detecting voltage between a contact point c arranged between the first detecting coil 31 and the third detecting coil 33 and a contact point d arranged between the second detecting coil 32 and the fourth detecting coil 34, and a torque calculating part 45 for calculating a torque applied to the shaft 100 based on the voltage measured by the voltage measuring circuit 44. The bridge circuit 42 is configured by arranging the first detecting coil 31 and the fourth detecting coil 34 at one of two sides facing each other, and arranging the second detecting coil 32 and the third detecting coil 33 at the other of the two sides facing each other.

In the measuring part 41, inductances L1 to L4 of the first to fourth detecting coil 31 to 34 are equal when the torque is not applied to the shaft 100, and the voltage detected by the voltage measuring circuit 44 becomes approximately zero.

When the torque is applied to the shaft 100, the magnetic permeability in the direction of +45° with respect to the axial direction decreases (or increases) while the magnetic permeability in the direction of −45° with respect to the axial direction increases (or decreases). Thus, the inductances in the first detecting coil 31 and the fourth detecting coil 34 decrease (or increase) while the inductances in the second detecting coil 32 and the third detecting coil 33 increase (or decrease), when the torque is applied to the shaft 100 while the AC voltage is applied from the transmitter 43. As a result, the voltage detected by the voltage measuring circuit 44 changes, and thus the torque calculating part 45 calculates the torque applied to the shaft 100 based on the change in voltage.

Since the first detecting coil 31 and the fourth detecting coil 34 have the same structure as the second detecting coil 32 and the third detecting coil 33 except the winding direction being different, the effects of the temperature or the like on the inductances of the first to fourth detecting coils 31 to 34 can be canceled by using the bridge circuit 42 shown in FIG. 3. And thus, the torque applied to the shaft 100 can be accurately detected. In addition, for the torque sensor 1, when the inductances in the first detecting coil 31 and the fourth detecting coil 34 increase (or decrease), while the inductances in the second detecting coil 32 and the third detecting coil 33 decrease (or increase). Thus, the detection sensitivity can be further improved by using the bridge circuit 42 shown in FIG. 3.

Explanation of the Shaft 100 and Method for Manufacturing the Same

In the present embodiment, an iron-based shaft member subjected to a carburizing, quenching and tempering process, thereafter shot peening, and then surface polishing is used as the shaft 100.

That is, the method for manufacturing the shaft 100 according to the present embodiment comprises a heat treatment step of subjecting an iron-based shaft member to a carburizing, quenching, and tempering process, a shot peening step of performing shot peening at least in a position on the shaft member, after the heat treatment step, to which the sensor portion is to be attached, and a surface polishing step of subjecting the shaft member after the shot peening to surface polishing.

For the shaft member used for the shaft 100, iron-based materials such as SCr420 (chromium steel), SCM420 (chromium-molybdenum steel), SNCM616 (nickel-chromium molybdenum steel) SUS440C (martensitic stainless), SUS630 (precipitation hardening stainless steel), and the like can be used. In the present embodiment, SCr420 is used for the shaft member.

The mechanical strength including the toughness of the shaft 100 can be enhanced by performing the carburizing, quenching, and tempering process on the entire shaft member. In the present embodiment, surface hardness of the shaft member after the heat treatment step is determined as not less than HV (Vickers hardness) 650. This is because if the surface hardness of the shaft member after the heat treatment step is low, the sensor sensitivity may decrease, or the hysteresis error may increase. The surface hardness of the shaft member after the heat treatment step is preferably at least equal to HV 650 in order to suppress deterioration of the sensor sensitivity and the hysteresis error. That is, in the heat treatment step, it is preferable to perform heat treatment in such a manner that the surface hardness of the shaft member after the heat treatment step is not less than HV 650. In the present embodiment, the heat treatment step is performed by gas carburization (at 920° C. for 3 hours, then at 830° C. for 15 min, and then oil quenching and tempering at 200° C. for 1.5 hours).

The shaft member is crooked when being subjected to the heat treatment step. Thus, it is preferable to perform a step of press-unbending the shaft member and a grinding step of grinding the surface of the shaft member to provide the shaft member with a straight shape, in addition to the heat treatment step. In the grinding step, it is preferable to perform grinding in such a manner that a grinding amount (grinding depth) at the part (referred to as the measuring part), to which the sensor portion 2 is to be attached, is even in the circumferential direction. This is because that a composition varies along the depth direction (radial direction) of the shaft member, and when the grinding amount (grinding depth) is uneven in the measuring part, portions with different compositions are generated on the surface of the measuring part and may cause the angle errors to be described later. In order to obtain the desired outer diameter after the grinding step, the shaft member before the heat treatment is preferably slightly larger than the finished outer diameter (for example, the shaft member before the heat treatment having a diameter of about 0.2 mm).

In the shot peening step, the shaft member after the heat treatment is subjected to the shot peening. Martensitic transformation (diffusionless transformation) occurs at the surface (a region distant with a predetermined depth from the surface) of the shaft 100 by shot peening the shaft member after heat treatment, so that non-magnetic retained austenite decreases, and ferromagnetic martensite can increase. As a result, the change in magnetic permeability when the torque is applied increases by reducing the non-magnetic area on the surface of the shaft 100 and increasing the magnetic area on the surface of the shaft 100. And thus, the sensitivity of the torque sensor 1 can be improved. The retained austenite is iron ($\gamma$-Fe) with face-centered cubic lattice structure in which the other elements are dissolved. The martensite is a solid solution in which carbon enters into a crystal of iron with body-centered tetragonal lattice structure.

In addition, the surface of the shaft member is work hardened by shot peening the shaft member after the heat treatment and thus the hysteresis characteristic is improved. More specifically, by shot peening the shaft member after the heat treatment, the magnetic domains (areas in which the direction of the magnetic moment is aligned) on the surface of the shaft 100 are subdivided, and the retained austenite serving as a pinning site for preventing movement of the magnetic domain wall, which is the boundary of the magnetic domains, is reduced. As a result, when the applied torque is released, the magnetic domains and the magnetic walls will be easily returned to the original state, and thus the hysteresis error decreases.

Figure 4A:
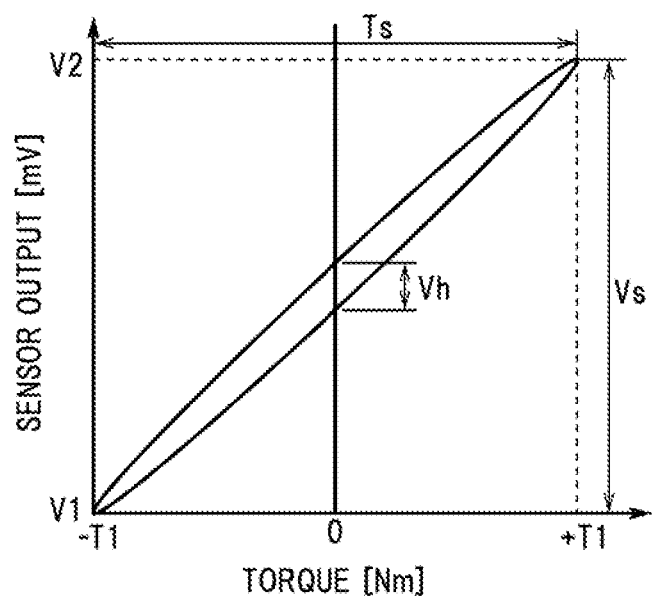
FIG. 4A is a diagram that illustrates sensitivity and hysteresis error.

As shown in FIG. 4A, the sensitivity of the torque sensor 1 is defined by dividing the sensor output V (mV) by the torque T (Nm) applied to the shaft 100, and expressed as V/T (mV/Nm). The sensor sensitivity is expressed as $(V2-V1)/(T2\times T1)=Vs/Ts$, where the torque T applied to the shaft 100 is not less than $-T1$ and not more than $+T1$, the sensor output corresponding to the torque $-T1$ is V1, and the sensor output corresponding to the torque $+T1$ is V2. The hysteresis error, which is also referred to as a linearity error, is a ratio of the maximum value Vh of a sensor output difference at the same torque between the torque increase and the torque decrease with respect to the sensor output Vs ($=V2-V1$), and is expressed as Vh/Vs (% FS, FS means a full-scale).

Figure 4B:
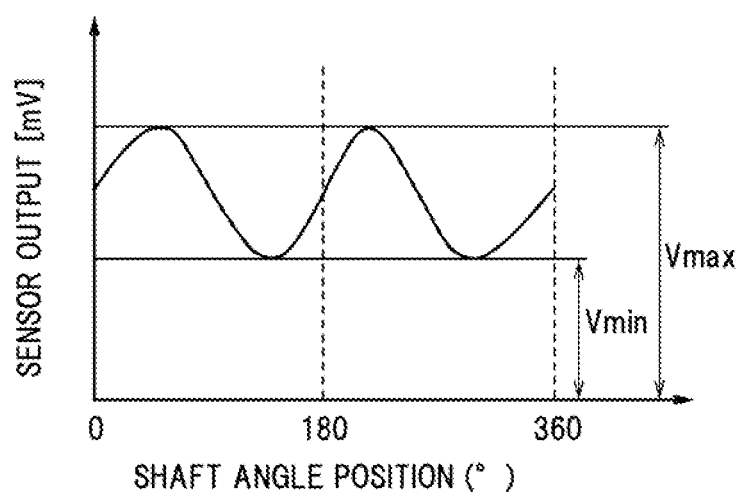
FIG. 4B is a diagram that illustrates an angle error.

In the present embodiment, in addition to the hysteresis error, the variation of the sensor output in the circumferential direction of the shaft 100 (hereinafter referred to as the angle error) is evaluated. As shown in FIG. 4B, the angle error means an error generated when the shaft is rotated. The angle error is expressed as $(Vmax-Vmin)/Vs$ (%), where the maximum value of the sensor output is Vmax and the minimum value is Vmin. Hereinafter, the sum of the hysteresis error and the angle error is referred to as a total error. In the present embodiment, a target value of the total error is not more than 3.0%.

In the present embodiment, chromium steel (SCr420) was used for the shaft member of the shaft 100, and optimum shot peening conditions was studied. In the present embodiment, the diameter of the shaft 100 was set as 18 mm. When performing the shot peening, the shot media was injected while rotating the shaft 100 at a low speed (e.g., 6 rpm).

Figure 5A:
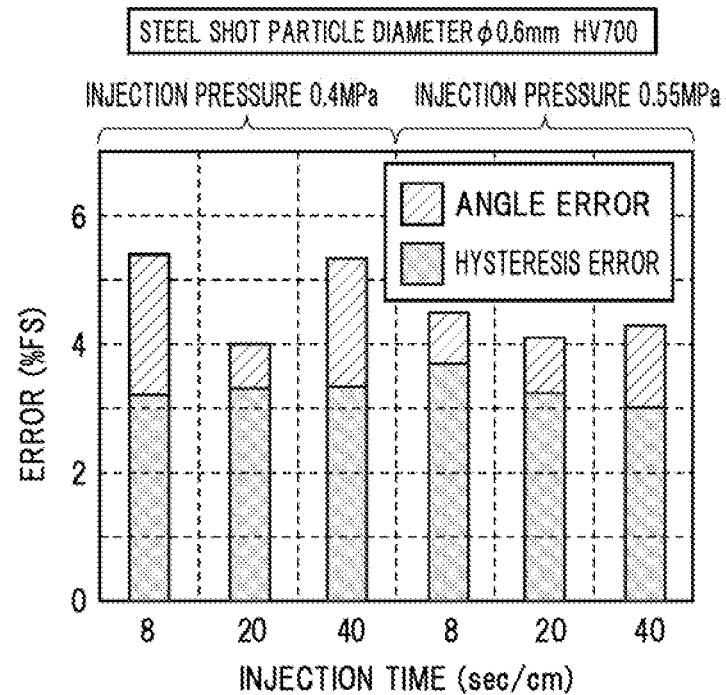
FIG. 5A is a diagram showing a measurement result of an error when steel shot media having a Vickers hardness of 700 is used.

Firstly, FIG. 5A shows error measuring result when using a steel shot media having the Vickers hardness of 700 (HV) and setting injection pressure as 0.4 MPa and 0.55 MPa. As shown in FIG. 5A, the total error is increased to not less than 4% when using the shot media having the Vickers hardness of 700 (HV). The error (hysteresis error and angle error) shown in FIG. 5A represents the maximum value including temperature characteristics (measured under conditions of ambient temperature from −40° C. to 150° C.). The horizontal axis of FIG. 5A represents the injection time of the shot media, and the injection time of the shot media is represented by dividing the total injection time by the length of the shaft 190. That is, the injection time of the shot media represents the injection time per 1 cm in the axial direction of the shaft 100 (hereinafter, simply referred to as the injection time).

Figure 5B:
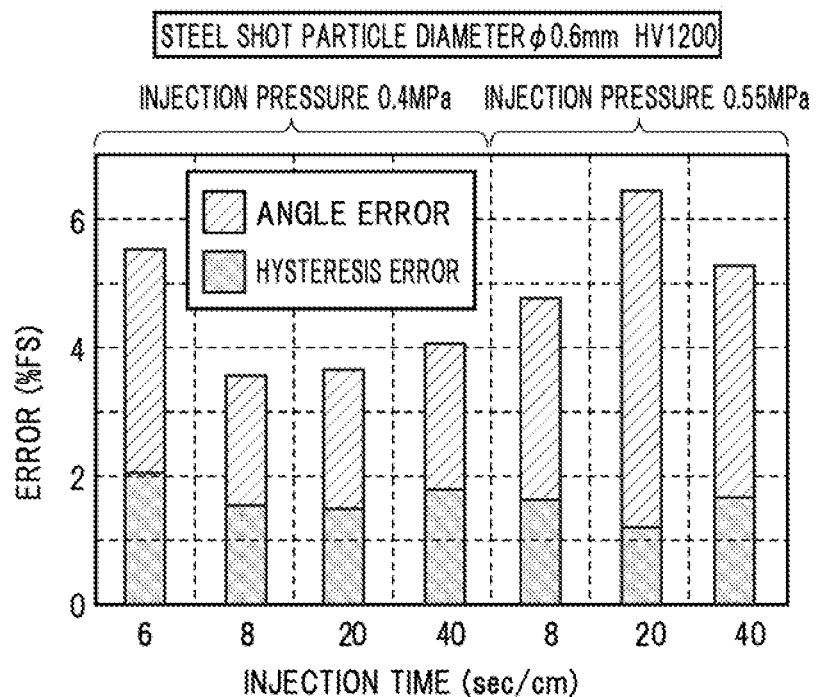
FIG. 5B is a diagram showing a measurement result of an error when a steel shot media having a Vickers hardness of 1200 is used.

Next, FIG. 5B shows error measuring result when using a steel shot media having the Vickers hardness of 1200 (HV) and setting injection pressure as 0.4 MPa and 0.55 MPa. As shown in FIG. 5B, when using the shot media having the Vickers hardness of 1200 (HV), the hysteresis error decreases as compared with the case using the shot media having the Vickers hardness of 700 (HV). Meanwhile, the angle error increases. As a result, the total error increases.

As described above, it has been found that the total error cannot be reduced only by increasing the hardness of the shot media. Therefore, the inventors studied the reason why the angle error increases. As the result of studies, the inventors have found that the angle error is largely increased due to $Fe_2B$ formed on the surface of the shaft member caused by boron included in the shot media.

In more detail, the steel shot media having the Vickers hardness of 1200 (HV) is doped with $Fe_2B$ in order to increase the hardness of the shot media. Thus, $Fe_2B$ is formed on the surface of the shaft member when such a shot media is used. $Fe_2B$ is considered to have a large angle error due to the large crystal magnetic anisotropy.

Thus, in the present embodiment, shot peening is performed by using a shot media having the Vickers hardness of 1200 (HV) and not including (i.e., being free of) boron in the shot peening step in order to reduce the angle error. In more detail, the shot media comprising zirconia ($ZrO_2$) is used. In the meantime, since hardness in the shot media varies, the shot media may have the Vickers Hardness of not less than 1100 and not more than 1300 (HV).

Further, $Fe_2B$ is not generated on the surface of the shaft member in shot peening by using the zirconia shot media that does not include boron. As a result, even though the shot media having high hardness such as Vickers hardness of 1200 (WV) is used, it is possible to suppress the increase in angle error. And thus, both the hysteresis error and the angle error can decrease and the sensor sensitivity can be improved.

Figure 6:
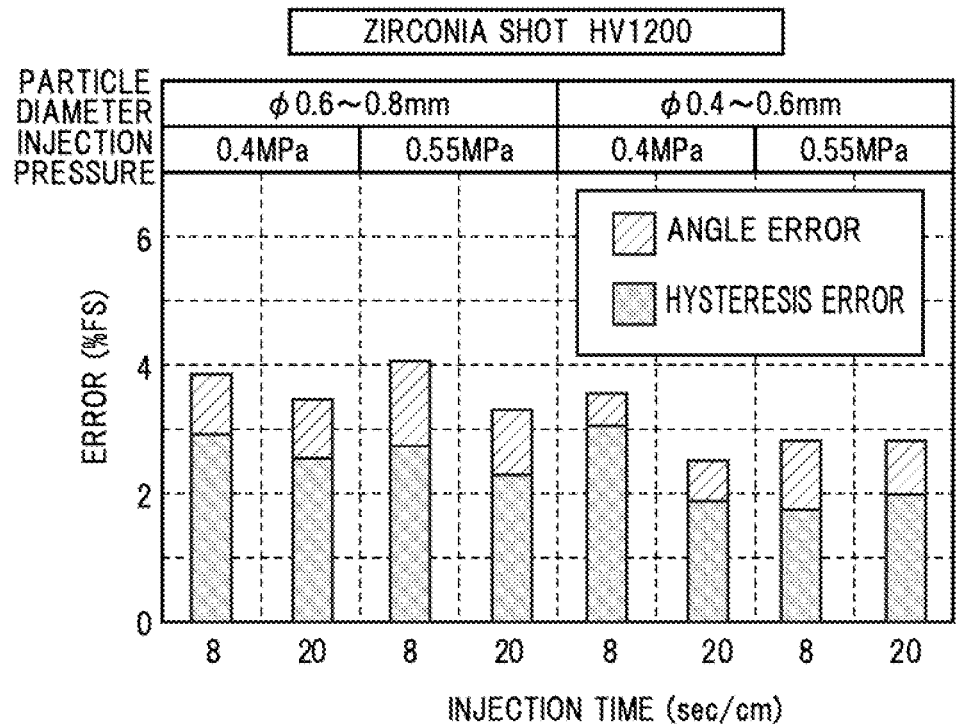
FIG. 6 is a diagram showing a measurement result of an error when a zirconia shot media having a Vickers hardness of 1200 is used.

For the case using the zirconia shot media having the Vickers hardness of 1200 (HV), optimum shot peening conditions were studied. FIG. 6 shows error measuring results when the particle diameter is set as not less than 0.6 mm and not more than 0.8 mm, or not less than 0.4 mm and not more than 0.6 mm, and injection pressure is set as 0.4 MPa or 0.55 MPa.

As shown in FIG. 6, when using the zirconia shot media having the Vickers hardness of 1200 (HV) and setting injection pressure of not less than 0.4 MPa and not more than 0.55 MPa, it is preferable to use the shot media having the particle diameter of not less than 0.4 mm and not more than 0.6 mm. In addition, it was understood from the measuring result in FIG. 6 that the total error is minimized when setting the injection pressure of 0.4 MPa and the injection time of 20 sec/cm.

Figure 7:
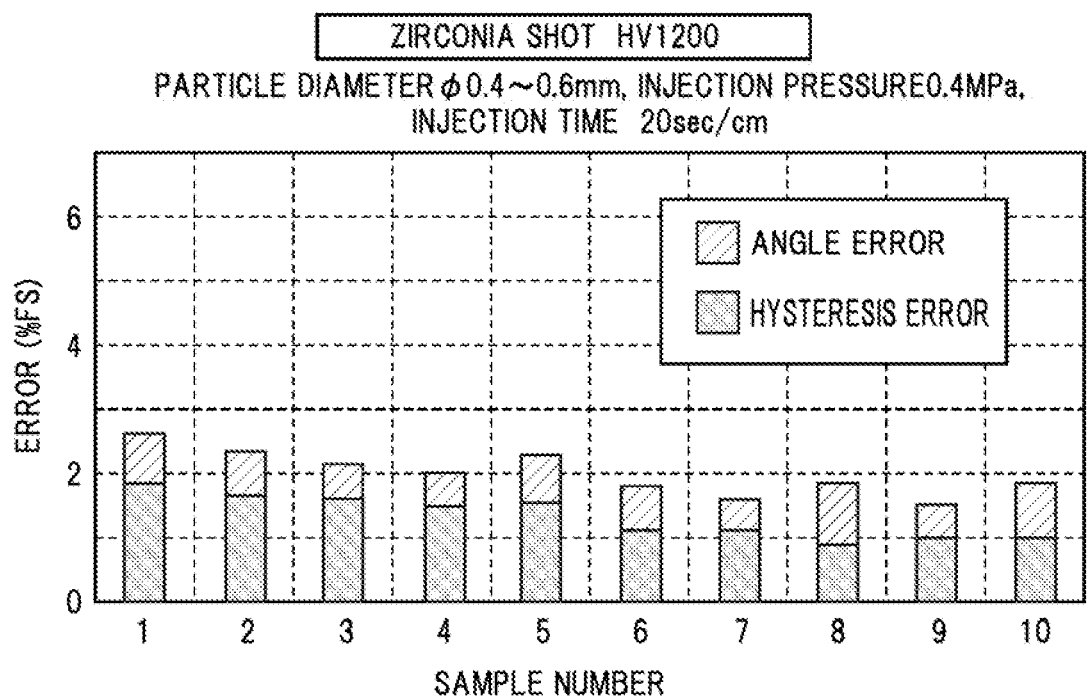
FIG. 7 is a diagram showing a measurement result of distribution of an error when a zirconia shot media having a Vickers hardness of 1200 is used and a predetermined shot condition is set.

FIG. 7 shows the error measuring result of ten samples of the shaft 100 that have been prepared under this condition for minimizing the total error. As shown in FIG. 7, although the total error varies within approximately 0.5%, each sample indicates the hysteresis of not more than 0.2% and the angle error of not more than 1.0%, and thus the total error of not more than 3.0%. It was confirmed that the target value has been obtained.

Effect of the Embodiment

As described above, a method for manufacturing a torque sensor 1 according to the present embodiment comprises a heat treatment step of subjecting an iron-based shaft member to a carburizing, quenching, and tempering process, and a shot peening step of performing shot peening using a steel shot media having a Vickers hardness at least equal to 1100 and at most equal to 1300 and being free of boron, at least in a position on the shaft member, after the heat treatment step, to which the sensor portion 2 is to be attached.

The non-magnetic retained austenite can decrease only on the surface of the shaft 100 by providing the shot peening step, and thus the deterioration of the toughness of the shaft 100 can be suppressed. The hysteresis error can decrease and the sensor sensitivity can be improved by performing the shot peening step with using a shot media having the high hardness of 1200 (HV). However, the angle error may increase due to the influence of boron when using the steel shot media having the Vickers hardness of 1200 (HV), since such a shot media includes boron. In the present embodiment, by using the shot media free of boron, $Fe_2B$ is not generated on the surface of the shaft member and thus the angle error can decrease. As a result, it is possible to obtain the torque sensor 1 having high sensor sensitivity while securing toughness and having the total error of not more than 3.0%.

SUMMARY OF THE INVENTION

Next, the technical concept grasped from the above-described embodiment is described with reference to the signs or the like in the embodiment. However, each reference sign or the like in the following description is not limited to a member or the like specifically showing the elements in the following claims in the embodiment.

[1] A method for manufacturing a magnetostrictive torque sensor shaft (100) to which a sensor portion (2) of a magnetostrictive torque sensor (1) is to be attached, the method comprising: heat treatment step of subjecting an iron-based shaft member to a carburizing, quenching, and tempering process; and a shot peening step of performing shot peening using a steel shot media having a Vickers hardness at least equal to 1100 and at most equal to 1300 and being free of boron, at least in a position on the shaft member, after the heat treatment step, to which the sensor portion (2) is to be attached.

[2] The method for manufacturing the magnetostrictive torque sensor shaft according to [1], wherein the shot media comprising zirconia is used.

[3] The method for manufacturing the magnetostrictive torque sensor shaft according to any one of [1] to [3], wherein the shot media having a particle diameter of not less than 0.6 mm is used, and an injection pressure is not less than 0.4 MPa and not more than 0.55 MPa in the shot peening step.

[4] The method for manufacturing the magnetostrictive torque sensor shaft according to any one of [1] to [3], wherein the shaft member comprises chromium steel.

[5] The method for manufacturing the magnetostrictive torque sensor shaft according to any one of [1] to [4], wherein the heat treatment process is performed in such a manner that a surface hardness of the shaft member after the heat treatment process comprises the Vickers hardness of not less than 650 HV.

Although the embodiments of the invention have been described, the invention according to claims is not to be limited to the embodiments. In addition, please note that all combinations of the features described in the embodiments are not necessary to solve the problem of the invention. Furthermore, the various kinds of modifications can be implemented without departing from the gist of the invention.

INDUSTRIAL APPLICABILITY

To provide a method for manufacturing a magnetostrictive torque sensor shaft capable of improving sensor sensitivity and reducing an error while securing toughness.

REFERENCE SIGNS LIST

1 TORQUE SENSOR (MAGNETOSTRICTIVE TORQUE SENSOR)
2 SENSOR PORTION
3 DETECTING COIL
100 SHAFT (MAGNETOSTRICTIVE TORQUE SENSOR SHAFT)

The invention claimed is:

1. A method for manufacturing a magnetostrictive torque sensor shaft to which a sensor portion of a magnetostrictive torque sensor is to be attached, the method comprising:
    heat treatment step of subjecting an iron-based shaft member to a carburizing, quenching, and tempering process; and
    a shot peening step of performing shot peening using a boron free shot media having a Vickers hardness at least equal to 1100 and at most equal to 1300 and being free of boron, at least in a position on the shaft member, after the heat treatment step, to which the sensor portion is to be attached,
    wherein the shot media comprising boron-free zirconia is used,
    wherein the shot media having a particle diameter of not less than 0.6 mm is used, and an injection pressure is not less than 0.4 MPa and not more than 0.55 MPa in the shot peening step,
    wherein the method further comprises a grinding step of grinding a surface of the shaft member, in such a manner that a grinding amount at the position to which the sensor portion is to be attached, is even in a circumferential direction, and
    wherein the surface of the shaft member, after shot peening, has a total error, including hysteresis error and angle error, of not more than 3%.

2. The method for manufacturing the magnetostrictive torque sensor shaft according to claim 1, wherein the shaft member comprises chromium steel.

3. The method for manufacturing the magnetostrictive torque sensor shaft according to claim 1, wherein the heat treatment process is performed in such a manner that a surface hardness of the shaft member after the heat treatment process comprises a Vickers hardness of not less than 650 HV.

4. The method for manufacturing the magnetostrictive torque sensor shaft according to claim 1, further comprising:
    a step of press-unbending the shaft member.

5. The method for manufacturing the magnetostrictive torque sensor shaft according to claim 1, wherein non-magnetic retained austenite is decreased and ferromagnetic martensite is increased on a surface of the shaft member.

6. The method for manufacturing the magnetostrictive torque sensor shaft according to claim 1, wherein the sensor portion comprises coils for detecting a change in magnetic permeability at angles +45° and −45°.

7. A method for manufacturing a magnetostrictive torque sensor including a sensor portion, the method comprising:
    a heat treatment step of subjecting an iron-based shaft member to a carburizing, quenching, and tempering process; and
    a shot peening step of performing shot peening using a boron free shot media having a Vickers hardness at least equal to 1100 and at most equal to 1300 and being free of boron, at least in a position on the shaft member, after the heat treatment step, to which the sensor portion is to be attached,
    an attaching step of attaching the sensor portion, comprising coils, to the shaft member for detecting a change in magnetic permeability at angles +45° and −45° at the position to which the sensor portion is attached,
    wherein the shot media comprising boron-free zirconia is used,
    wherein the shot media having a particle diameter of not less than 0.6 mm is used, and an injection pressure is not less than 0.4 MPa and not more than 0.55 MPa in the shot peening step,
    wherein the method further comprises a grinding step of grinding a surface of the shaft member, in such a manner that a grinding amount at the position to which the sensor portion is to be attached, is even in a circumferential direction, and
    wherein the surface of the shaft member, after shot peening, has a total error, including hysteresis error and angle error, of not more than 3%.

8. The method for manufacturing the magnetostrictive torque sensor according to claim 7, wherein non-magnetic retained austenite is decreased and ferromagnetic martensite is increased on the surface of the shaft member.

* * * * *